(12) United States Patent
Kang et al.

(10) Patent No.: US 9,547,036 B2
(45) Date of Patent: Jan. 17, 2017

(54) ORGANIC LIGHT EMITTING DIODE DISPLAY, AND FABRICATING AND INSPECTING METHODS THEREOF

(71) Applicant: LG DISPLAY CO., LTD., Seoul (KR)

(72) Inventors: ImKuk Kang, Paju-Si (KR); SungJun Yun, Ansan-Si (KR); WooCheol Jeong, Goyang-Si (KR)

(73) Assignee: LG Display Co., Ltd., Seoul (KR)

( * ) Notice: Subject to any disclaimer, the term of this patent is extended or adjusted under 35 U.S.C. 154(b) by 101 days.

(21) Appl. No.: 14/565,160

(22) Filed: Dec. 9, 2014

(65) Prior Publication Data
US 2015/0162393 A1    Jun. 11, 2015

(30) Foreign Application Priority Data
Dec. 9, 2013 (KR) .......................... 10-2013-0152502

(51) Int. Cl.
*H01L 27/32* (2006.01)
*G01R 31/26* (2014.01)
*H01L 51/05* (2006.01)

(52) U.S. Cl.
CPC ....... *G01R 31/2635* (2013.01); *H01L 51/0554* (2013.01); *H01L 27/3262* (2013.01); *H01L 2227/323* (2013.01)

(58) Field of Classification Search
CPC ............. H01L 27/3223; H01L 27/3262; H01L 51/0554; H01L 51/055
See application file for complete search history.

(56) References Cited

U.S. PATENT DOCUMENTS

| 2007/0165180 A1* | 7/2007 | Cho | G02F 1/136286 349/187 |
| 2008/0296582 A1* | 12/2008 | Zhao | G02F 1/136259 257/72 |
| 2013/0235292 A1* | 9/2013 | Hara | G02F 1/136213 349/41 |

\* cited by examiner

*Primary Examiner* — Anne Hines
(74) *Attorney, Agent, or Firm* — Birch, Stewart, Kolasch & Birch, LLP

(57) ABSTRACT

Discussed are an organic light emitting diode display which can minimize a malfunction due to an open failure caused in a fabricating process of the organic light emitting diode display using thin film transistors as control elements, and fabricating and inspecting method of the organic light emitting diode display. Accordingly, at least one contact part is further formed by forming an upper metal layer of a dual gate structure with respect to an area in which an open failure easily occurs due to a step difference on a substrate of the organic light emitting diode display, so that a signal can be normally applied even when the open failure occurs.

11 Claims, 10 Drawing Sheets

ORGANIC LIGHT EMITTING DIODE DISPLAY, AND FABRICATING AND INSPECTING METHODS THEREOF

CROSS-REFERENCE TO RELATED APPLICATIONS

Pursuant to 35 U.S.C. §119(a), this application claims the benefit of earlier filing date and right of priority to Korean Application No. 10-2013-0152502, filed on Dec. 9, 2013, the contents of which is incorporated by reference herein in its entirety.

BACKGROUND OF THE INVENTION

Field of the Invention

The present disclosure relates to an organic light emitting diode display, and particularly, to an organic light emitting diode display which can minimize a malfunction due to an open failure caused in a fabricating process of the organic light emitting diode display using thin film transistors as control elements, and fabricating and inspecting method of the organic light emitting diode display.

Description of the Related Art

A liquid crystal display, a field emission display, a plasma display panel, an organic light emitting diode display (OLED display), and the like are used as flat panel displays for substituting for cathode ray tubes.

Among these displays, organic light emitting diodes provided in the OLED display have characteristics of high luminance and low operating voltage, and are self-luminescent. Hence, the OLED display has a high contrast ratio and can be implemented as an ultra-thin display. Also, the OLED display has a response time of a few microseconds (μs) to easily realize moving pictures. Also the OLED display has no limitation of a viewing angle, and is stable even at low temperature.

FIG. 1 is an equivalent circuit diagram of a pixel of an OLED display according to the related art.

Referring to FIG. 1, the pixel PX of the OLED display has a structure having three thin film transistors SWT, DRT and SST and one capacitor C1, and includes an organic light emitting diode EL; a driving thin film transistor DRT for supplying current to the organic light emitting diode EL; a scan thin film transistor SWT for receiving a data voltage Vdata, the scan thin film transistor SWT being connected to the driving thin film transistor DRT to the data voltage Vdata to a gate electrode of the driving thin film transistor DRT according to a scan signal Vscan; a sensing thin film transistor SST connected between a sensing controller and the driving thin film transistor DRT to sink the current supplied from the driving thin film transistor DRT according to a sensing signal Vref; and a capacitor C1 connected between the gate electrode and a source electrode of the driving thin film transistor DRT.

In order to implement realize high resolution images that require high quality of full-HD or more in the OLED display, each pixel should be configured to have a high aperture ratio structure. The high-resolution display has a high probability that a failure such as corrosion, non-patterning or step difference failure may occur in a fabrication process of the high-resolution display, as compared with the existing high-resolution displays. Accordingly, a defect detection method and an efficient repair method are required.

Particularly, in the OLED display having the pixel structure described above, there frequently occurs a failure that a line for connecting between the source electrode of the driving thin film transistor DRT and an anode electrode of the organic light emitting diode EL is opened. The lines are formed in different metal layers to be contacted with each other, and the upper metal layer is over-etched in an etching process due to a step difference of the lower metal layer, thereby resulting in the failure.

FIG. 2 is a sectional view illustrating an example in which an open failure occurs in the OLED display according to a related art.

Referring to FIG. 2, in the OLED display, a gate metal layer 13, a gate insulating layer 15, a first source and drain metal layer 22, a passivation layer 25, a second source and drain metal layer 27, an interlayer insulating layer 31 and an anode metal layer 43 are sequentially formed on a substrate 10.

Such a structure is referred to a face seal structure. In the structure, the second source and drain metal layer 27 acts as an auxiliary gate electrode of the driving thin film transistor (DRT of FIG. 1). That is, the driving thin film transistor has a dual gate structure in which the gate electrode of the driving thin film transistor is configured with two metal layers, i.e., the gate metal layer 13 and the second source and drain metal layer 27.

As shown in this figure, the passivation layer 25 performs a function of insulating the first source and drain metal layer 22 beneath the second source and drain metal layer 27. The passivation layer 25 has one side opened so that the anode metal layer 43 is electrically connected to the first source and drain metal layer 22 through the second source and drain metal layer 27.

In an etching process of the second source and drain metal layer 27, the second source and drain metal layer 27 is over-etched due to a step difference caused by the lower passivation layer 25, and therefore, an open failure frequently occurs in the second source and drain metal layer 27. Accordingly, an electrical signal is not normally applied to the anode metal layer 43.

This becomes a factor that causes an unexpected malfunction of the OLED display, thereby deteriorating the driving reliability of the display.

SUMMARY OF THE INVENTION

Therefore, an aspect of the present invention is to provide an organic light emitting diode display and a fabricating method thereof, which can minimize, through a redundancy structure, a malfunction due to an open failure caused by a step difference in a fabricating process of the organic light emitting diode display.

Another aspect of the present invention is to provide an inspecting method of the organic light emitting diode display, which can easily detect and repair a failure even in a pixel structure in which an additional open failure occurs.

To achieve these and other advantages and in accordance with the purpose of this specification, as embodied and broadly described herein, an organic light emitting diode display according to an embodiment of the present invention includes: a substrate; a gate metal layer formed on the substrate; a gate insulating layer and an etching stop layer, formed on the gate metal layer to expose a portion of the gate metal layer; a first source and drain metal layer formed on the etching stop layer; a passivation layer formed on the first source and drain metal layer to expose a predetermined area of the first source and drain metal layer; a second source and drain metal layer formed on the passivation layer, the second source and drain metal layer being contacted with the first source and drain metal layer having the exposed predetermined area; an interlayer insulating layer having first and second contact holes through which first and second areas of the second source and drain metal layer are exposed, respectively; and an anode metal layer formed on the interlayer insulating layer to cover the first contact hole, the anode metal layer being extended in one direction to cover the second contact hole.

To achieve these and other advantages and in accordance with the purpose of this specification, as embodied and broadly described herein, a method of fabricating an organic light emitting diode display, according to an embodiment of the present invention includes: preparing a substrate; forming a gate metal layer on the substrate; forming a gate insulating layer and an etching stop layer on the gate metal layer; forming a first source and drain metal layer on the etching stop layer; forming a passivation layer for exposing a predetermined area of the first source and drain metal layer; forming, on the passivation layer, a second source and drain metal layer contacted with the first source and drain metal layer; forming an interlayer insulating layer having first and second contact holes through which first and second areas of the second source and drain metal layer are exposed, respectively; and forming, on the interlayer insulating layer, an anode metal layer for covering the first contact hole, the anode metal layer being extended in one direction to cover the second contact hole.

To achieve these and other advantages and in accordance with the purpose of this specification, as embodied and broadly described herein, according to an embodiment of the present invention, a method of inspecting an organic light emitting diode display comprising an organic light emitting diode, a switching thin film transistor, a driving thin film transistor and a sampling thin film transistor, which control the organic light emitting diode, the method includes: applying a first voltage of a DC waveform to gate and drain electrodes of the switching thin film transistor; applying the first voltage to a drain electrode of the driving thin film transistor; and applying a second voltage of a DC waveform to a drain electrode of the sampling thin film transistor, and applying a third voltage that swings with a predetermined width to a gate electrode of the sampling thin film transistor.

According to an embodiment of the present invention, at least one contact part is further formed by forming an upper metal layer of a dual gate structure with respect to an area in which an open failure easily occurs due to a step difference on the substrate of the organic light emitting diode display, so that a signal can be normally applied even when the open failure occurs.

Further, although an additional open failure may occur, a voltage of a predetermined potential is applied, thereby easily deciding the occurrence of an open failure.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWING

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF EXEMPLARY EMBODIMENTS

Description will now be given in detail of the exemplary embodiments of the present invention, with reference to the accompanying drawings. For the sake of brief description with reference to the drawings, the same or equivalent components will be provided with the same reference numbers, and description thereof will not be repeated.

Figure 1:
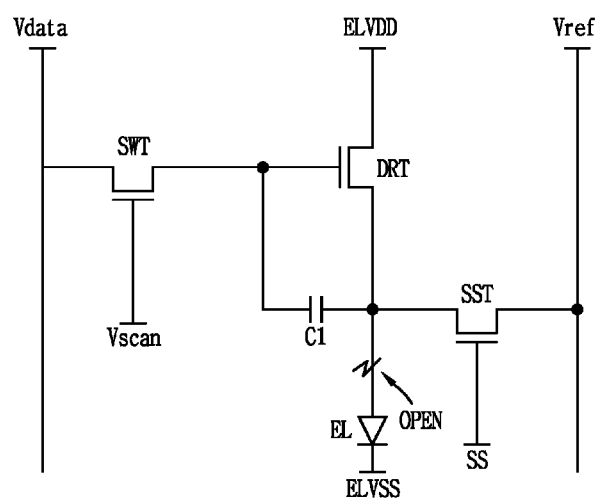
FIG. 1 is an equivalent circuit diagram of a pixel of an organic light emitting diode display according to a related art.
Figure 2:
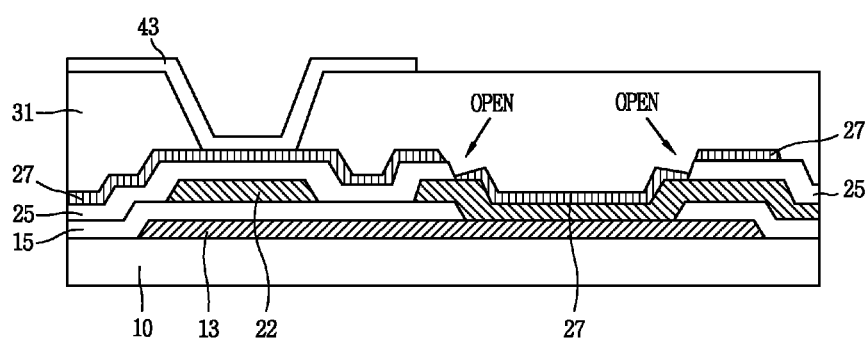
FIG. 2 is a sectional view illustrating an example in which an open failure occurs in the organic light emitting diode display according to the related art.
Figure 3:
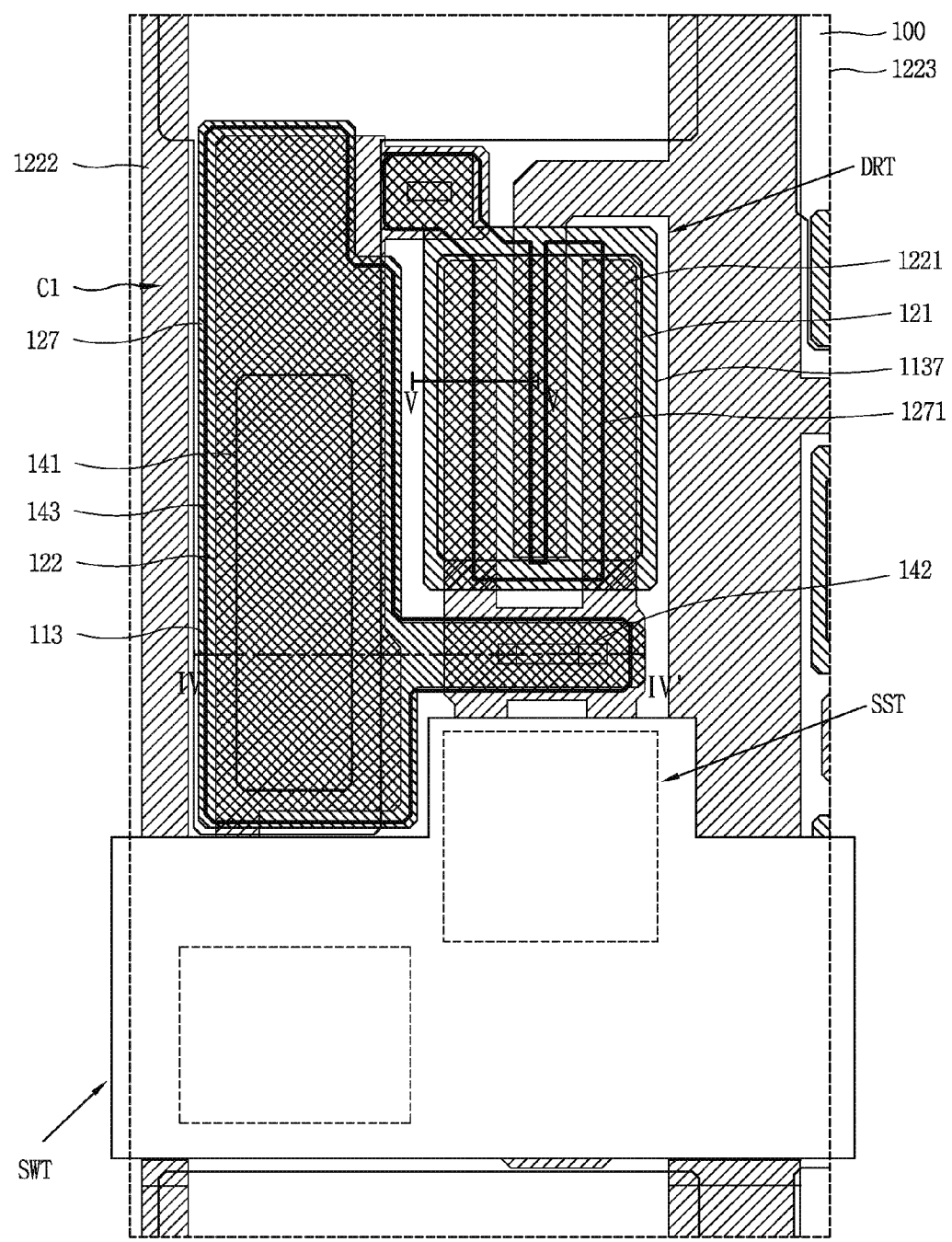
FIG. 3 is a plan view of a pixel of an organic light emitting diode display according to an exemplary embodiment of the present invention.
Figure 4A:
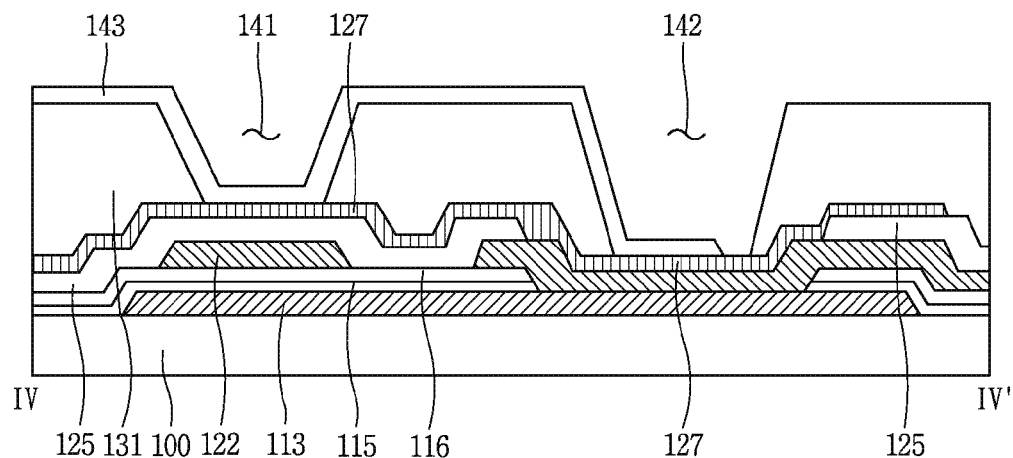
FIGS. 4A and 4B are section views illustrating respectively portions IV-IV' and V-V' of FIG. 3.
Figure 4B:
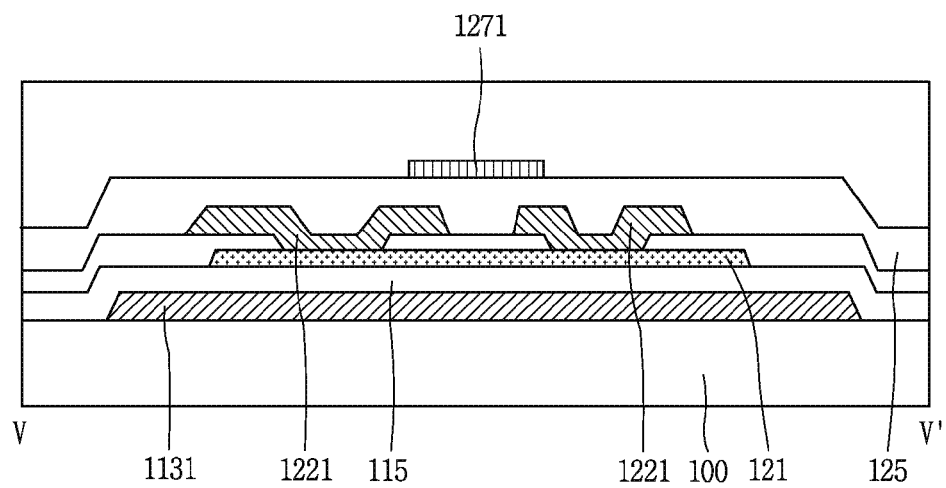

FIG. 3 is a plan view of a pixel of an organic light emitting diode display according to an exemplary embodiment of the present invention, and FIGS. 4A and 4B are section views respectively illustrating portions IV-IV' and V-V' of FIG. 3. The pixel of the organic light emitting diode display according to one or more embodiments of the present invention includes three thin film transistors.

Referring to FIGS. 3-4B, in the organic light emitting diode display according to the present disclosure, a gate metal layer 113 including a gate electrode and a signal line is formed on a substrate 100. Here, the substrate 100 may be made of a flexible plastic material having flexibility so that the organic light emitting diode display can maintain display performance as it is even though it is bent like paper.

The gate metal layer 113 may be formed into a single-layered structure including a first metal material having a low resistance characteristic, e.g., any one of aluminum (Al), aluminum alloy (AlNd), copper (Cu), copper alloy, molybdenum (Mo) and moly-titanium (MoTi), or may be formed into a double- or triple-layered structure including two or more thereof. The gate metal layer 113 forms a lower electrode of a capacitor C1. The gate metal layer 113 is extended to form a gate electrode 1131 of a driving thin film transistor DRT.

A gate insulating layer 115 and an etching stop layer 116, made of an insulating material, e.g., silicon oxide ($SiO_2$) or silicon nitride ($SiN_x$) that is an inorganic material are formed on the entire surface of a display area of the substrate including the gate metal layer 113.

A semiconductor layer 121 made of any one selected from amorphous silicon, polysilicon and semiconductor oxide, corresponding to each thin film transistor SWT, SST or DRT, is formed between the gate insulating layer 115 and the etching stop layer 116. A partial area of the semiconductor layer 121 is exposed through contact holes formed in the etching stop layer 116, and a first source and drain metal layer 122 including source and data electrodes 1221 of the driving thin film transistor DRT, a line 1222 for applying a data signal Vdata, and a line 1223 for applying a power voltage ELVDD is formed on the gate insulating layer 115 and the etching stop layer 116 including the contact holes.

Here, the first source and drain metal layer 122 may be made of, for example, a combination of any one or more of aluminum (Al), aluminum alloy (AlNd), copper (Cu), copper alloy, molybdenum (Mo), moly-titanium (MoTi), chrome (Cr) and titanium (Ti).

Particularly, the source and drain electrodes 1221 made of the metal material are formed in the driving thin film transistor DRT. Here, the source and drain electrodes 1221 are spaced apart from each other and contacted with the semiconductor layer 121 exposed through the contact holes. Accordingly, the gate electrode 1131, the gate insulating layer 115, the semiconductor layer 121, and the source and drain electrodes 1221 constitute one driving thin film transistor DRT. In addition to the driving thin film transistor DRT, a switching thin film transistor SWT and a sampling thin film transistor SST are also formed into the same stack structure.

Here, gate and drain electrodes of the switching thin film transistor SWT are respectively connected to scan and data lines, and a source electrode of the switching thin film transistor SWT is electrically connected to the gate electrode of the driving thin film transistor DRT. The source electrode of the driving thin film transistor DRT is connected to a source electrode of the sampling thin film transistor SST.

The first source and drain metal layer 122 constitutes an upper electrode of the capacitor C1.

Meanwhile, in these figures, the case where the first source and drain metal layer 122 has a single-layered structure is shown as an example. However, the first source and drain metal layer 122 may be formed into a double- or triple-layered structure by a combination of two metal materials.

A passivation layer 125 that covers the driving thin film transistor DRT and exposes a portion of the first source and drain metal layer 122 is formed on the first source and drain metal layer 122. Particularly, a partial area of the passivation layer 125 is etched to expose the first source and drain metal layer 122 beneath the passivation layer 125. The passivation layer 125 is contacted with a second source and drain metal layer 127 formed thereon.

The second source and drain metal layer 127 is formed on the passivation layer 125. The second source and drain metal layer 127 may be formed of the same material as the first source and drain metal layer 122. Particularly, the second source and drain metal layer 127 includes an auxiliary gate electrode 1271 patterned above the driving thin film transistor DRT so that the same voltage applied to the gate electrode 1131 is applied thereto, thereby forming a dual gate structure.

The auxiliary gate electrode 127 is extended up to the exposed area of the first source and drain metal layer 122 to be contacted with the first source and drain metal layer 122. Accordingly, the auxiliary gate electrode 127 allows a signal supplied from the first source and drain metal layer 122 to be applied up to an anode metal layer 143.

An interlayer insulating layer 131 is formed on the second source and drain metal layer 127. A first contact hole 141 for exposing the second source and drain metal layer 127 formed beneath the interlayer insulating layer 131 is formed in a partial area of the interlayer insulating layer 131, and the anode metal layer 143 having a form separated for each pixel is formed on the interlayer insulating layer 131 including the first contact hole 141.

Here, the area exposed by the first contact hole 141 is overlapped with the capacitor C1 that the gate metal layer 113 and the first source and drain metal layer 122 constitute. The area exposed by the first contact hole 141 is defined as a first area with which the second source and drain metal layer 127 and the anode metal layer 142 are contacted.

In the first area, the first source and drain metal layer 122 and the second source and drain metal layer 127 are insulated from each other by the passivation layer 125.

The anode metal layer 143 constitutes an anode electrode of the organic light emitting diode. Although not shown in these figures, an organic light emitting layer configured with organic light emitting patterns (not shown) for respectively emitting red, green and blue and a cathode electrode (not shown) are formed on the anode metal layer 143. Accordingly, the anode metal layer 143, the cathode electrode, and the organic light emitting layer interposed between the two electrodes constitute the organic light emitting diode.

Here, the organic light emitting layer may be formed into a single-layered structure including an organic light emitting material. Alternatively, the organic light emitting layer may be formed into a multi-layered structure including a hole injection layer, a hole transporting layer, a light emitting material layer, an electron transporting layer and an electron injection layer in order to increase light emitting efficiency.

Particularly, in the present disclosure, the anode metal layer 143 is extended in one direction up to a second contact hole 142 of the interlayer insulating layer 131, through which the second source and drain metal layer 127 not overlapped with the passivation layer 125 is exposed, to be redundantly contacted with the second source and drain metal layer 127.

That is, in addition to the first contact hole 141 formed in the area overlapped with the passivation layer 125, the second contact hole 142 is further formed corresponding to the area in which the first source and drain metal layer 122 and the second source and drain metal layer 127 are contacted by etching the passivation layer 125 in the interlayer insulating layer 131 included in one pixel. The anode metal layer 143 is extended up to the second contact hole 142 so that the second source and drain metal layer 127 and the anode metal layer 143 are redundantly contacted.

Here, the area exposed by the second contact hole 142 is defined as a second area in which the gate metal layer 113, the first source and drain metal layer 122, the second source and drain metal layer 127 and the anode metal layer 143 are sequentially formed to be directly contacted with each other.

According to the structure described above, although an open failure of the second source and drain metal layer 127 occurs due to a step difference of the passivation layer 125 in an etching process of the second source and drain metal layer 127, the electrical connection between the anode metal layer 143 and the first source and drain electrode 122 is unchanged. The signal supplied to the anode metal layer 143 is the power voltage ELVDD applied through the driving thin film transistor DRT.

Meanwhile, at least one passivation layer, an organic layer, a protective film and the like, which prevent moisture from penetrating into the organic light emitting layer, are further formed on the anode metal layer 143, thereby forming one organic light emitting diode display.

Hereinafter, a method of fabricating the organic light emitting diode display according to an embodiment of the present invention will be described with reference to FIGS. 5A to 5H.

Figure 5A:
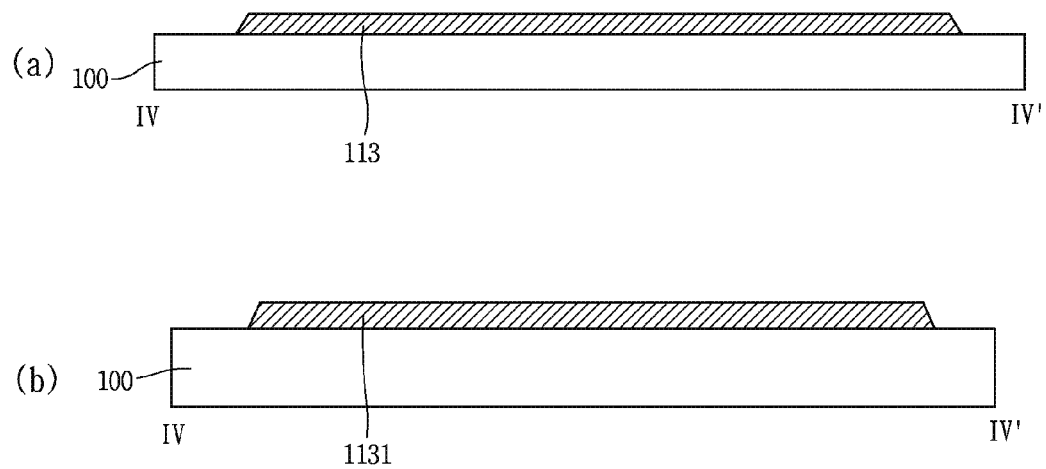
FIGS. 5A to 5H are process sectional views illustrating a fabricating method of the organic light emitting diode display according to an exemplary embodiment of the present invention.

FIGS. 5A to 5H are process sectional views of portions IV-IV' and V-V' of FIG. 3, illustrating a fabricating method of the organic light emitting diode display according to the exemplary embodiment. First, referring to FIG. 3A, (a) of FIG. 5A illustrates the portion IV-IV' of FIG. 3, which is an area in which the anode electrode and the driving thin film transistor are connected, and (b) of FIG. 5A illustrates the portion V-V' of FIG. 3, which is an area of the driving thin film transistor.

First, a substrate 100 is prepared which becomes an object on which a pixel pattern is to be formed. Here, the substrate 100 may be made of a flexible plastic material having flexibility so that the organic light emitting diode display can maintain display performance as it is even though it is bent.

Next, a buffer layer (not shown) made of an insulating material, e.g., silicon oxide (SiO2) or silicon nitride (SiNx) that is an inorganic insulating material is formed on the substrate 100. The buffer layer may be omitted according to characteristics of a semiconductor layer (not shown).

Subsequently, a first metal material having a low resistance characteristic is formed on the buffer layer. For example, the first metal material may be formed into a single-layered structure including any one of aluminum (Al), aluminum alloy (AlNd), copper (Cu), copper alloy, molybdenum (Mo) and moly-titanium (MoTi), or may be formed into a double- or triple-layered structure including a combination of two or more thereof. The first metal material is patterned using a mask, thereby forming a gate metal layer 113 including a signal line and a gate electrode 1131 of the driving thin film transistor. An example in which the gate metal layer 113 and the gate electrode 1131 have a single-layered structure is shown in this figure.

Figure 5B:
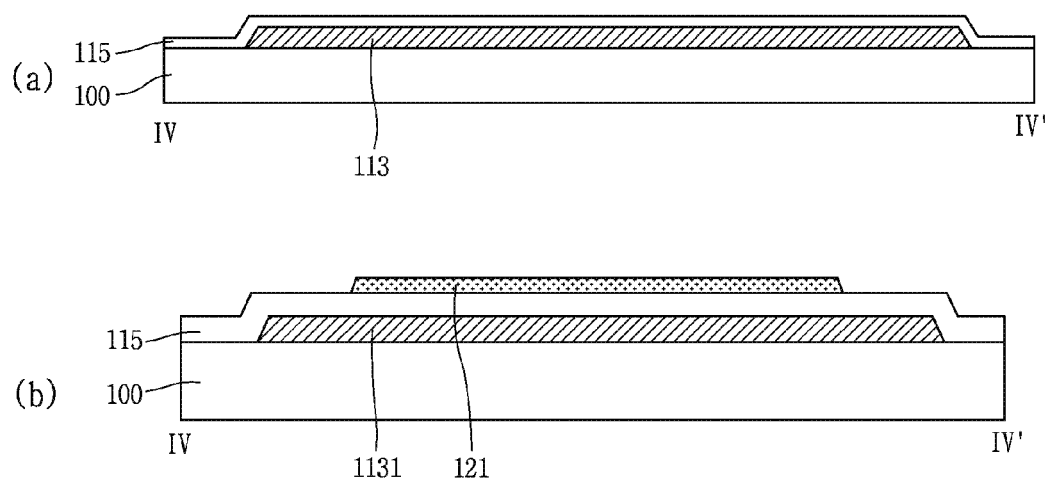

Next, referring to FIG. 5B, a gate insulating layer 115 made of silicon oxide (SiO2) or silicon nitride (SiNx) that is an inorganic insulating material is formed on the substrate 100 including the gate metal layer 113 and the gate electrode 1131. Subsequently, a semiconductor layer 121 made of any one selected from amorphous silicon, polysilicon and semiconductor oxide is formed corresponding to the gate electrode 1131.

Figure 5C:
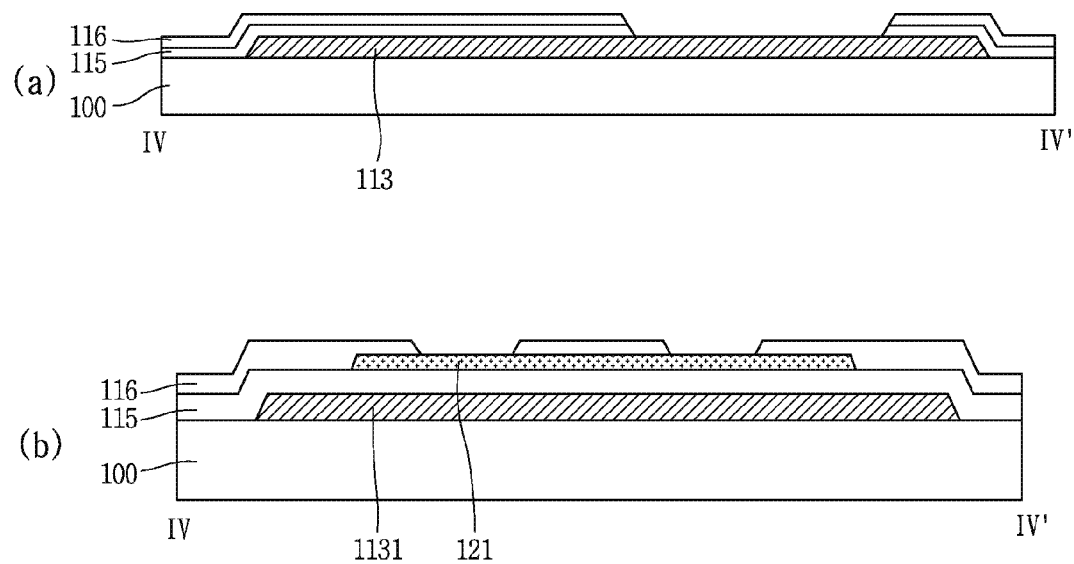

Subsequently, referring to FIG. 5C, an insulating material is deposited on the gate insulating layer 115 and the semiconductor layer 121. The insulating material is patterned together with a partial area of the gate insulating layer 115, thereby forming an etching stop layer 116 for partially exposing the gate metal layer 113 and the semiconductor layer 121.

Figure 5D:
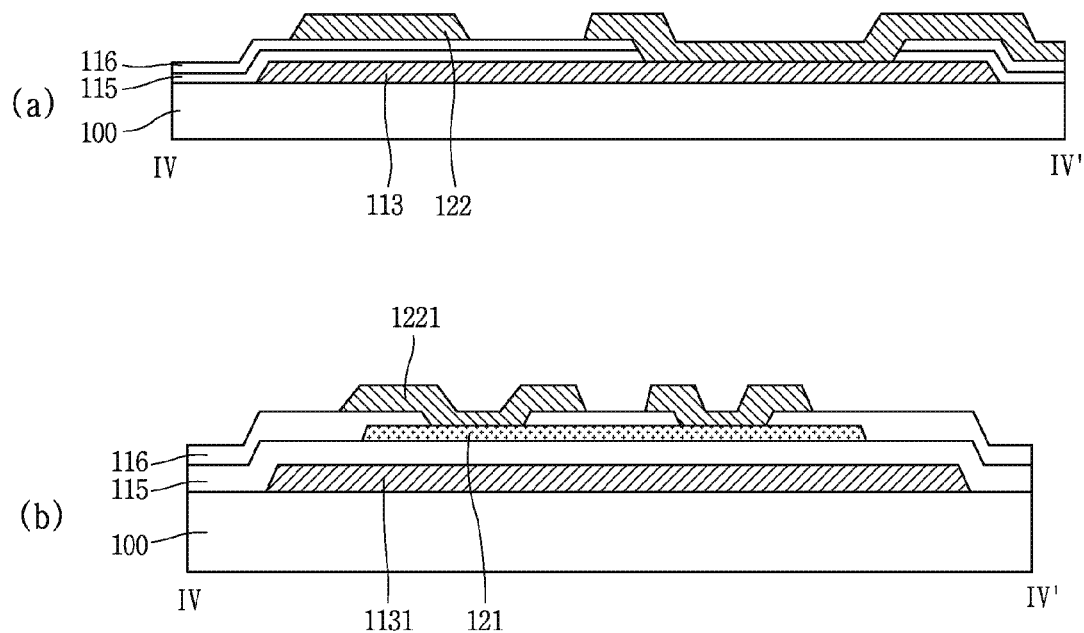

Next, referring to FIG. 5D, a second metal material is deposited and patterned on the etching stop layer 116, thereby forming a first source and drain metal layer 122 and source and drain electrodes 2221 of the driving thin film transistor. Here, the second metal material may include one or more of aluminum (Al), aluminum alloy (AlNd), copper (Cu), copper alloy, molybdenum (Mo), moly-titanium (MoTi), chrome (Cr) and titanium (Ti).

Also, a data line through which a data signal is applied, a power line (not shown) through which a power voltage is applied, and the like are formed together when the second metal material is patterned. As the second metal material is contacted and pattern on the semiconductor layer 121 of the driving thin film transistor, exposed through a contact hole of the etching stop layer 116, the source and drain electrodes 1221 made of the second metal material are simultaneously formed. Accordingly, the gate electrode 1131, the semiconductor layer 121, and the source and drain electrodes 1221, which are sequentially stacked in the area of the driving thin film transistor, constitute one driving thin film transistor.

Here, the case where the first source and drain metal layer 122 has a single-layered structure is shown as an example. However, the first source and drain metal layer 122 may be formed into a double- or triple-layered structure by combining two different metal materials.

Although not shown in this figure, a switching thin film transistor and a sampling thin film transistor may also be formed into the same stack structure as the driving thin film transistor.

Figure 5E:
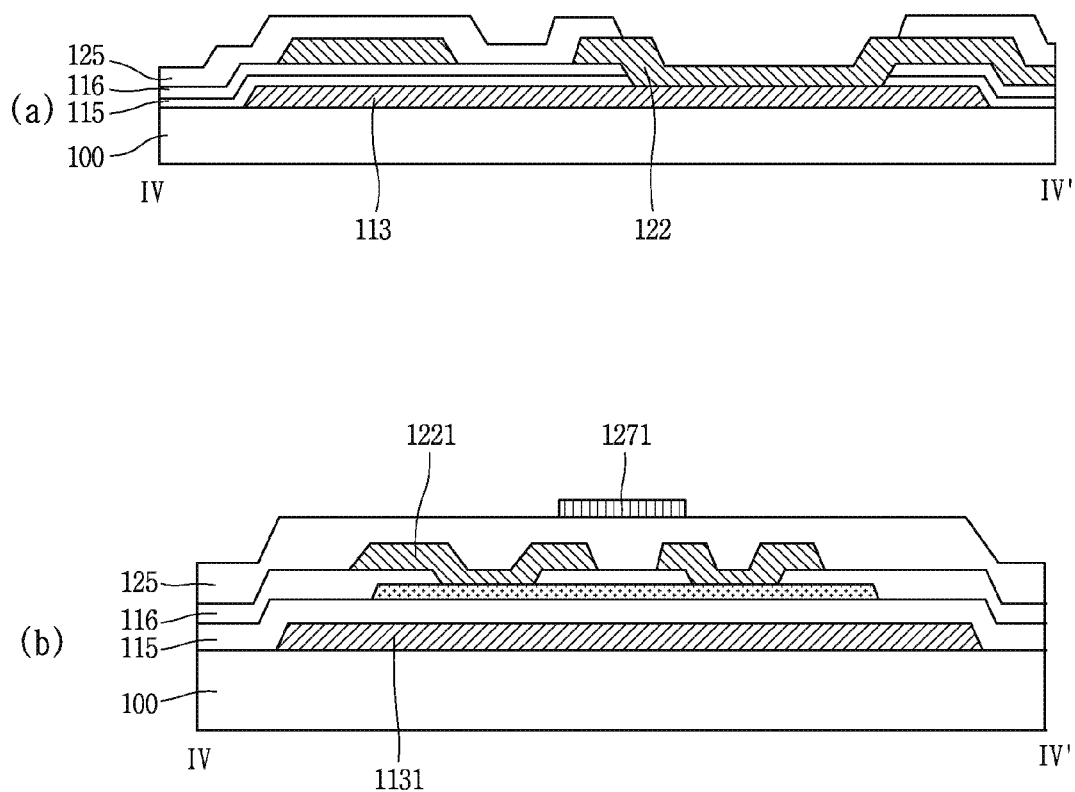

Next, referring to FIG. 5E, an insulating material is deposited and patterned on the entire surface of the substrate 100 including the first source and drain metal layer 122, thereby forming a passivation layer 125. Here, the passivation layer 125 allows a portion of the first source and drain metal layer 122 formed therebeneath to be exposed through a patterning process.

Figure 5F:
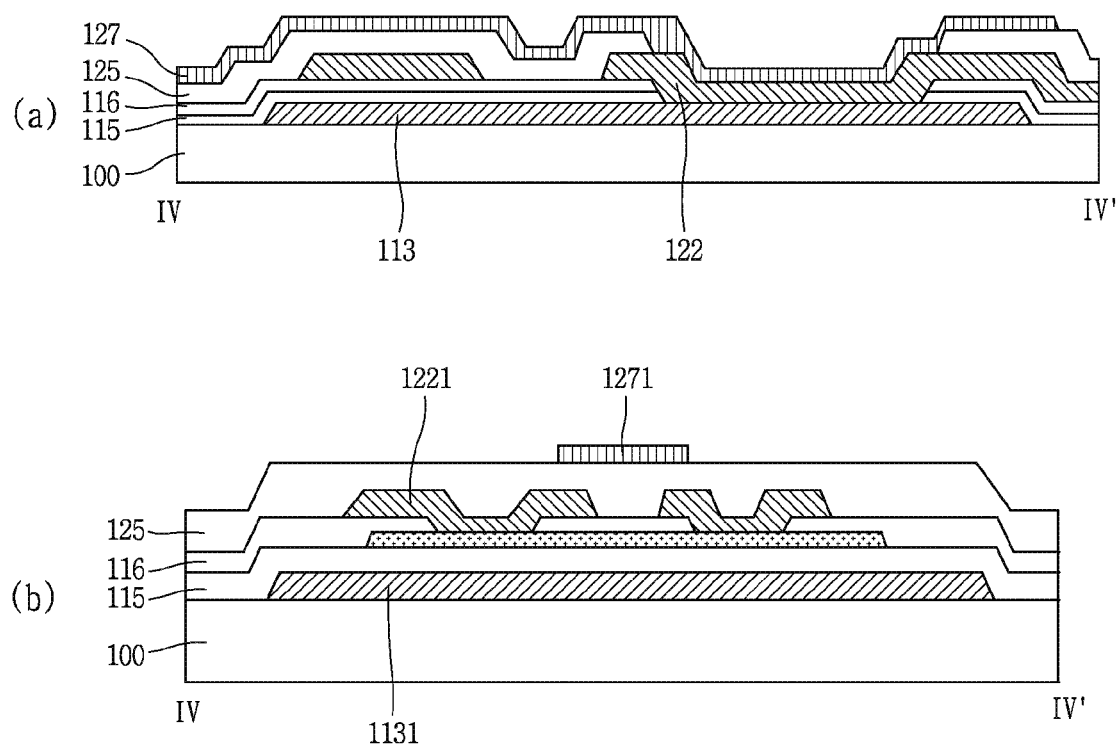

Subsequently, referring to FIG. 5F, a third metal material is deposited and patterned to cover the top of the passivation layer 125, thereby forming a second source and drain metal layer 127 and an auxiliary gate electrode 1271 of the driving thin film transistor. Here, the third metal material may be the same material as the second metal material constituting the first source and drain metal layer 127.

Particularly, in this process, the second source and drain metal layer 127 is contacted with the first source and drain metal layer 122 through a contact hole formed in the passivation layer 125, so that a signal applied from the first source and drain metal layer 122 is supplied to the second source and drain metal layer 127. As the same signal applied to the gate electrode 1131 is applied to the auxiliary gate electrode 1271, the driving thin film transistor of a dual gate structure is implemented.

Figure 5G:
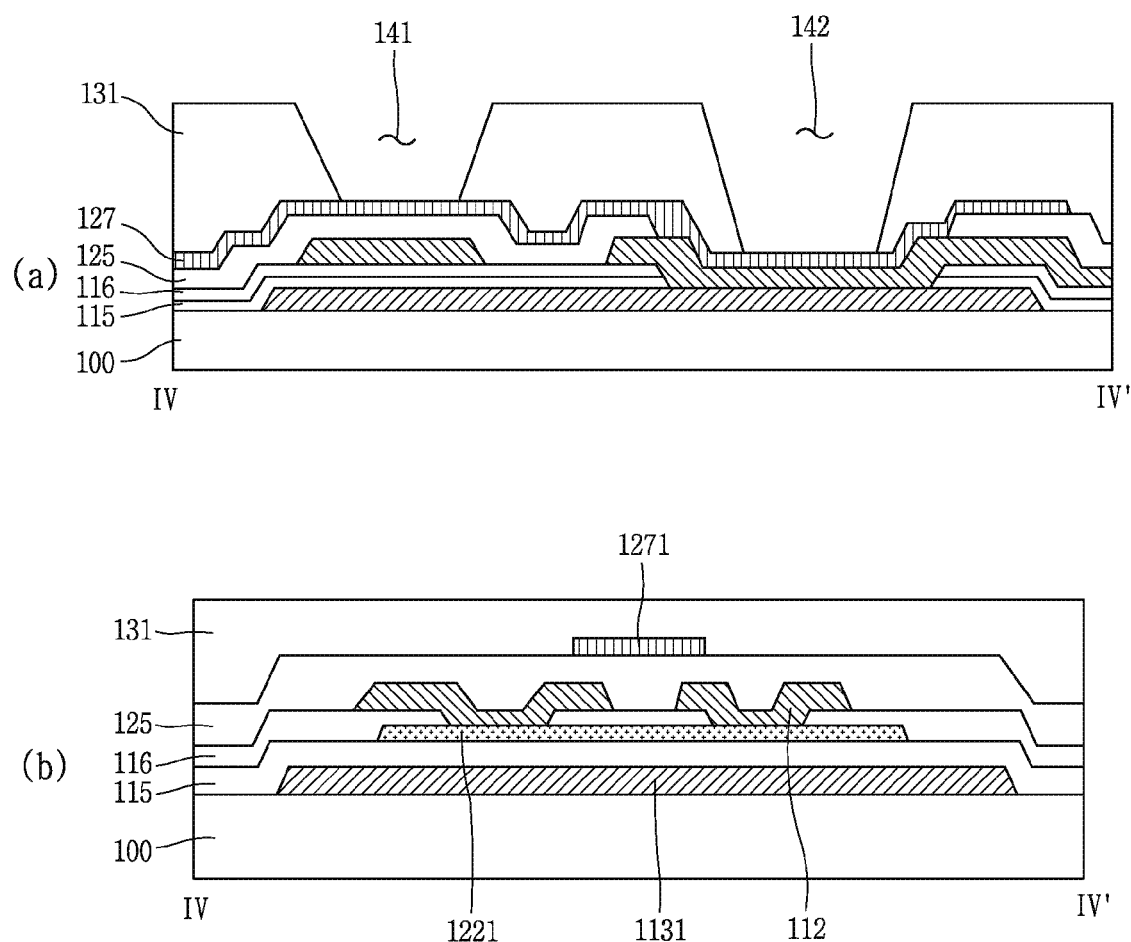
Figure 5H:
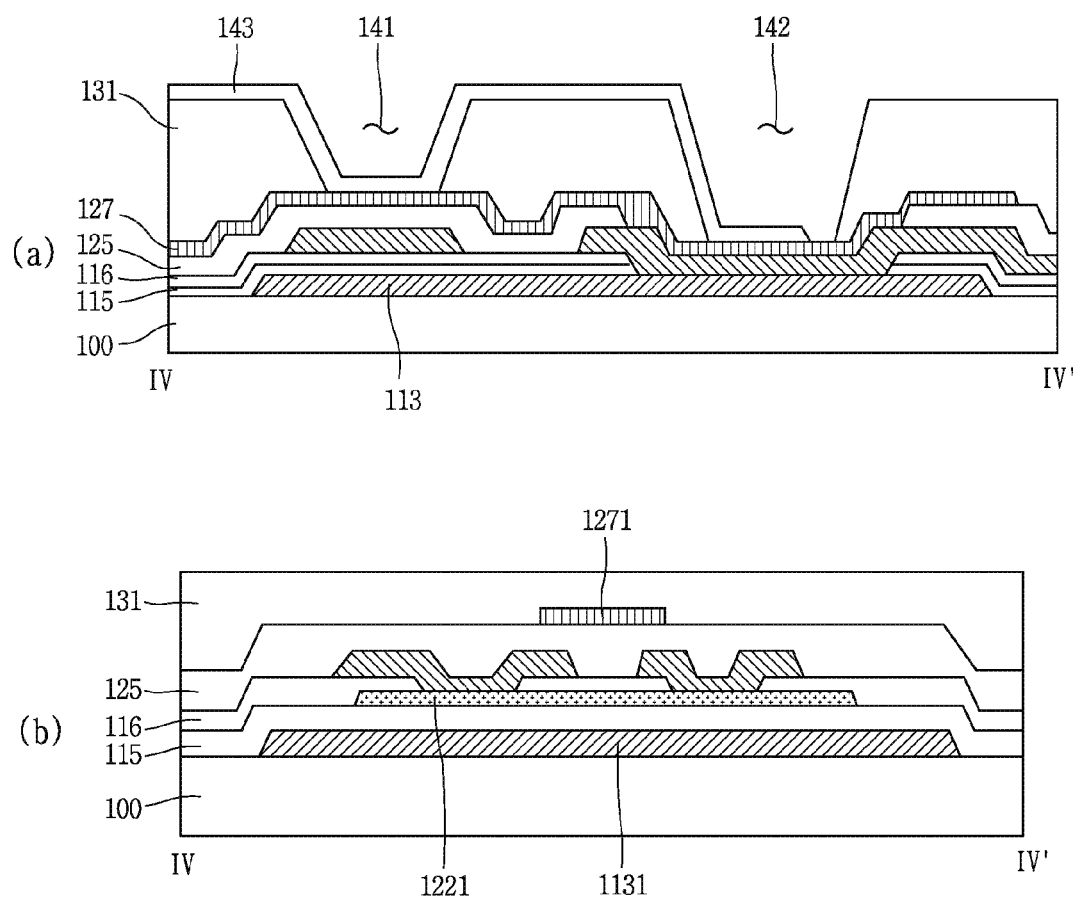

Next, referring to FIG. 5G, silicon oxide (SiO2), silicon nitride (SiNx) or the like that is an inorganic insulating material is deposited and patterned on the entire surface of the substrate 100 including the second source and drain metal layer 127 and the auxiliary gate electrode 1271, thereby forming an interlayer insulating layer 131. Particularly, after the insulating material is deposited, first and second contact holes 141 and 142 through which at least two areas are exposed with respect to the second source and drain metal layer 127 are formed on the interlayer insulating layer 131 through a patterning process. The first contact hole 141 is formed to be overlapped with a capacitor on the capacitor, and the second contact hole 142 is formed on an area in which the first source and drain metal layer 122 and the second source and drain metal layer 127 are directly contacted. Subsequently, referring to FIG. 5H, a transparent metal material such as ITO is deposited on the interlayer insulating layer 131 and then selectively patterned, thereby forming an anode metal layer 143 of a dual gate structure. The anode metal layer 143 is contacted with the second source and drain metal layer 127 through the first and second contact holes 141 and 142, and has a form separated for each pixel.

Particularly, in the exemplary embodiment, the anode metal layer 143 is further extended in one direction up to the second contact hole, as compared with the conventional art, to be directly contacted with the second source and drain metal layer 127 of which top is exposed through the second contact hole 142.

Accordingly, although an open failure occurs in the second source and drain metal layer 127 due to a step difference of the passivation layer 125, the anode metal layer 143 receives a normal signal applied as the contact of the anode metal layer 143 with the second source and drain metal layer 127 directly contacted with the first source and drain metal layer 121 is maintained.

Although not shown in this figure, at least one passivation layer, an organic layer, a protective film and the like, which prevent moisture from penetrating into the organic light emitting layer, are further formed on the anode metal layer 143, thereby completing the fabricating process of one organic light emitting diode display.

Meanwhile, a method of inspecting whether the anode metal layer of the dual gate structure is normally formed in the organic light emitting diode display according to the exemplary embodiment and detecting an open failure that additionally occurs even though the anode metal layer is normally formed will be described.

Figure 6A:
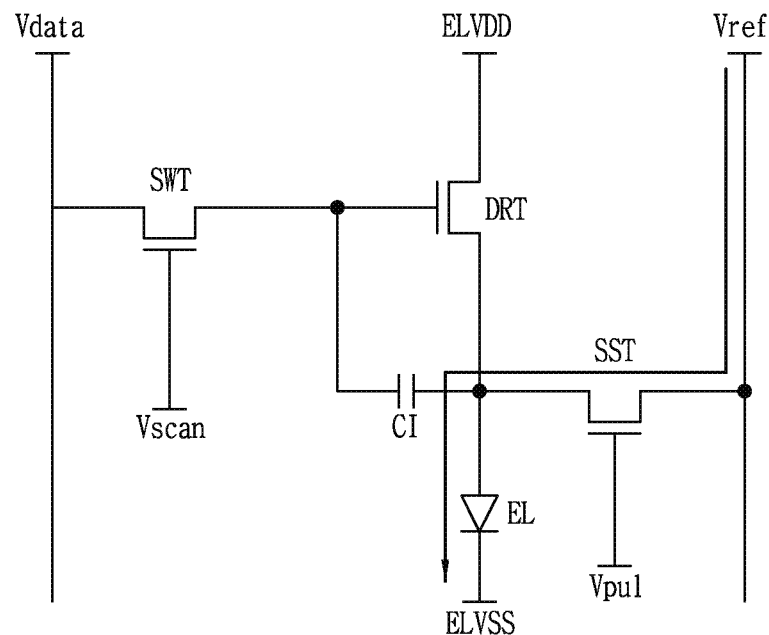
FIG. 6A is an equivalent circuit diagram of a pixel, illustrating an open failure inspecting method of the organic light emitting diode display according to the exemplary embodiment of the present invention.
Figure 6B:
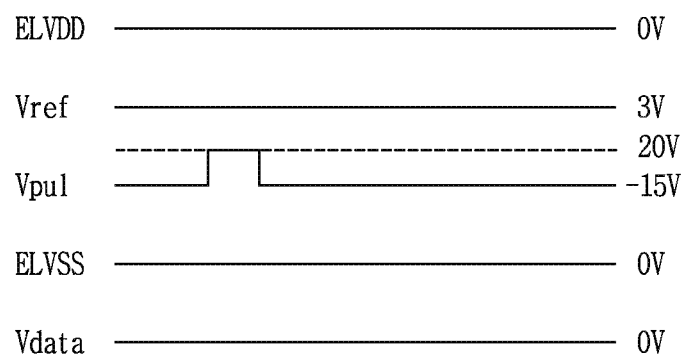
FIG. 6B is a signal waveform diagram of signals applied to the pixel of FIG. 6A.

FIG. 6A is an equivalent circuit diagram of a pixel, illustrating an open failure inspecting method of the organic light emitting diode display according to the exemplary embodiment, and FIG. 6B is a signal waveform diagram of signals applied to the pixel of FIG. 6A.

Referring to FIGS. 6A and 6B, the open failure inspecting method of the organic light emitting diode display of the present disclosure is a method of inspecting an open failure between an organic light emitting diode EL and a driving thin film transistor DRT, and includes applying a first voltage of a DC waveform to gate and drain electrodes of a switching thin film transistor SWT, applying the first voltage to a drain electrode of the driving thin film transistor DRT, and applying a second voltage of a DC waveform to a drain electrode of a sampling thin film transistor SST and applying a third voltage that swings with a predetermined width to a gate electrode of the sampling thin film transistor SST.

Specifically, a power voltage ELVDD applied to the drain electrode of the driving thin film transistor DRT, a data voltage Vdata applied to the drain electrode of the switching thin film transistor SWT, and a ground voltage ELVSS applied to a cathode electrode of the organic light emitting diode EL are all controlled to 0V that is the first voltage.

In addition, a reference voltage Vref applied through the sampling thin film transistor SST is fixed to 3V that is the second voltage, and the third voltage that is a voltage Vpul for controlling the reference voltage Vref is applied as a waveform that swings between −15V and 20V.

Accordingly, the occurrence of an open failure between the organic light emitting diode EL and the driving thin film transistor DRT can be easily detected with any separate detection means according to a light emitting form of the organic light emitting diode EL.

When it is decided according to the inspecting method that an open failure has occurred as the organic light emitting diode EL does not emit light or the luminance of light emitted from the light emitting diode EL is remarkably low, the insulating structure formed on the first source and drain metal layer (122 of FIG. 4A) or the second source and drain metal layer (127 of FIG. 4A) adjacent to the anode metal layer (143 of FIG. 4A) is etched so that a partial area of the insulating structure is exposed, and a short-circuit pattern that covers the anode metal layer and the exposed area is further formed, thereby performing repair. A CVD zapping method may be applied as such a repair method.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting diode display, comprising:
   a substrate;
   a gate metal layer on the substrate;
   a gate insulating layer and an etching stop layer on the gate metal layer to expose a portion of the gate metal layer;
   a first source and drain metal layer on the etching stop layer;
   a passivation layer on the first source and drain metal layer to expose a predetermined area of the first source and drain metal layer;
   a second source and drain metal layer on the passivation layer being contacted with the first source and drain metal layer having the exposed predetermined area;
   an interlayer insulating layer having first and second contact holes through which first and second areas of the second source and drain metal layer are exposed, respectively; and
   an anode metal layer on the interlayer insulating layer to cover the first contact hole, the anode metal layer being extended to cover the second contact hole.

2. The organic light emitting diode display of claim 1, further comprising:
   a gate electrode disposed in the same layer as the gate metal layer;
   a semiconductor layer disposed to be overlapped with the gate electrode on the gate insulating layer;
   source and drain electrodes disposed in the same layer as the first source and drain metal layer, the source and drain electrodes being contacted with the semiconductor layer through the area exposed by the etching stop layer; and
   an auxiliary gate electrode disposed to be overlapped with the semiconductor layer in the same layer as the second source and drain metal layer.

3. The organic light emitting diode display of claim 1, wherein the first area is an area in which the gate metal layer and the first source and drain metal layer constitute a capacitor, and the first and second metal layers are insulated from each other.

4. The organic light emitting diode display of claim 1, wherein the second area is an area in which the first source and drain metal layer and the second source and drain metal layer are directly contacted with each other.

5. A method of fabricating an organic light emitting diode display, the method comprising:
   preparing a substrate;
   forming a gate metal layer on the substrate;
   forming a gate insulating layer and an etching stop layer on the gate metal layer;

forming a first source and drain metal layer on the etching stop layer;

forming a passivation layer for exposing a predetermined area of the first source and drain metal layer;

forming, on the passivation layer, a second source and drain metal layer contacted with the first source and drain metal layer;

forming an interlayer insulating layer having first and second contact holes through which first and second areas of the second source and drain metal layer are exposed, respectively; and forming, on the interlayer insulating layer, an anode metal layer for covering the first contact hole, the anode metal layer being extended to cover the second contact hole.

6. The method of claim 5, wherein the forming of the gate metal layer on the substrate comprises forming a gate electrode of a thin film transistor in the same layer as the gate metal layer.

7. The method of claim 6, wherein the forming of the gate insulating layer and the etching stop layer comprises:

forming the gate insulating layer on the entire surface of the substrate including the gate metal layer;

forming a semiconductor layer of the thin film transistor to be overlapped with the gate electrode; and exposing a predetermined area of the semiconductor layer and forming the etching stop layer on the gate insulating layer.

8. The method of claim 7, wherein the forming of the first source and drain metal layer comprises forming source and drain electrodes formed in the same layer as the first source and drain metal layer, the source and drain electrodes being contacted with the semiconductor layer through the area exposed by the etching stop layer.

9. The method of claim 8, wherein the forming of the second source and drain metal layer comprises forming an auxiliary gate electrode overlapped with the semiconductor layer in the same layer as the second source and drain metal layer.

10. The method of claim 5, wherein the first area is an area in which the gate metal layer and the first source and drain metal layer constitute a capacitor, and the first and second metal layers are insulated from each other.

11. The method of claim 5, wherein the second area is an area in which the first source and drain metal layer and the second source and drain metal layer are directly contacted with each other.

* * * * *